United States Patent
Kawase

(10) Patent No.: US 8,786,071 B2
(45) Date of Patent: Jul. 22, 2014

(54) WIRING PATTERN HAVING A STUB WIRE

(75) Inventor: Yoshitaka Kawase, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/504,443

(22) PCT Filed: Nov. 2, 2010

(86) PCT No.: PCT/JP2010/006475
§ 371 (c)(1),
(2), (4) Date: Apr. 26, 2012

(87) PCT Pub. No.: WO2011/058720
PCT Pub. Date: May 19, 2011

(65) Prior Publication Data
US 2012/0211903 A1    Aug. 23, 2012

(30) Foreign Application Priority Data

Nov. 11, 2009    (JP) .................................. 2009-258196

(51) Int. Cl.
*H01L 23/52*    (2006.01)

(52) U.S. Cl.
USPC ............. 257/691; 257/E23.079; 257/E23.153

(58) Field of Classification Search
USPC ............................ 257/691, E23.079, E23.153
See application file for complete search history.

(56) References Cited

U.S. PATENT DOCUMENTS

| 5,903,050 A | * | 5/1999 | Thurairajaratnam et al. | 257/695 |
| 6,268,644 B1 | | 7/2001 | Umehara | |
| 2002/0074162 A1 | | 6/2002 | Su | |
| 2009/0236701 A1 | | 9/2009 | Sun | |

FOREIGN PATENT DOCUMENTS

| DE | 10158374 C1 | | 4/2003 |
| EP | 1168607 A2 | | 1/2002 |
| JP | 2004-140210 A | | 5/2004 |
| JP | 2004228989 A | * | 8/2004 |
| JP | 2005-327903 A | | 11/2005 |
| JP | 2006-032572 A | | 2/2006 |
| WO | 98/36454 A1 | | 8/1998 |

OTHER PUBLICATIONS

English machine translation of JP2006-032572 to Tomioka et al.*
English machine translation of JP2004-228989A.*

* cited by examiner

*Primary Examiner* — Tom Thomas
*Assistant Examiner* — Christopher M Roland
(74) *Attorney, Agent, or Firm* — Canon USA, Inc. IP Division

(57) ABSTRACT

A pad for a line which supplies an electric power potential is disposed on a semiconductor integrated circuit and a pad which is not electrically connected to any other electric circuit is disposed on a semiconductor integrated circuit board, and the two pads are connected through a bonding wire. An LC resonant circuit is configured with ease using a floating capacitance C of the pad which is in an electrically open state and which is disposed in a vacant region and an inductance value L of the bonding wire which is disposed in a three-dimensional manner. High-frequency noise is filtered and high-density implementation is realized.

4 Claims, 6 Drawing Sheets

WIRING PATTERN HAVING A STUB WIRE

TECHNICAL FIELD

The present invention relates to semiconductor devices on which semiconductor integrated circuits are mounted, and particularly relates to electric-power noise of a semiconductor device.

BACKGROUND ART

In general, as a countermeasure against high-frequency noise generated from semiconductor devices such as semiconductor packages, a method for implementing a bypass capacitor between a power-supply line and a ground (GND) pattern has been known. However, a capacity of the bypass capacitor is limited, and therefore, it is difficult to sufficiently supply current to a semiconductor device only using current supplied from the bypass capacitor. Therefore, a core power supply unit directly supplies current to the semiconductor device more than a little.

Japanese Patent Laid-Open No. 2004-140210 discloses a countermeasure against high-frequency noise spreading to a printed circuit board which is generated by supplying current from a core power supply unit. Specifically, Japanese Patent Laid-Open No. 2004-140210 discloses a printed circuit board configured such that a stub wiring is disposed between a bypass capacitor and a core power supply unit so that impedance lower than that of a power-supply path is obtained. That is, current including high-frequency noise is allowed to be supplied to the stub wiring and is reflected at an open end whereby noise current supplied from a semiconductor integrated circuit is cancelled.

CITATION LIST

Patent Literature

PTL 1: Japanese Patent Laid-Open No. 2004-140210

SUMMARY OF INVENTION

Technical Problem

However, in recent years, since printed circuit boards have been made to be high density, a length and a width of a stub wiring to be formed on the printed circuit boards are strictly limited. Accordingly, a range of control of the impedance of the stub wiring is considerably small and it is difficult to attain a sufficient noise reduction effect.

Accordingly, the present invention provides a printed circuit board which achieves high-density implementation and which efficiently suppresses high-frequency noise. Furthermore, the present invention provides a semiconductor device capable of considerably controlling a filter constant in accordance with a semiconductor integrated circuit.

Solution to Problem

The present invention provides a semiconductor device including a semiconductor integrated circuit board, a semiconductor integrated circuit implemented on the semiconductor integrated circuit board, pads which are disposed on the semiconductor integrated circuit, and pads which are disposed on the semiconductor integrated circuit board and which are connected to the pads disposed on the semiconductor integrated circuit through bonding wires. The bonding wires include an electric-power bonding wire configured to connect an electric-power pad disposed on the semiconductor integrated circuit board to an electric-power pad disposed on the semiconductor integrated circuit, a ground bonding wire configured to connect a ground pad disposed on the semiconductor integrated circuit board to a ground pad disposed on the semiconductor integrated circuit, a signal bonding wire configured to connect a signal pad disposed on the semiconductor integrated circuit board to a signal pad disposed on the semiconductor integrated circuit, and a stub wiring bonding wire configured to connect an electric-power pad disposed on the semiconductor integrated circuit to a non-connected pad which is not electrically connected to any other electric circuit and which is disposed on the semiconductor integrated circuit board.

Further features of the present invention will become apparent from the following description of exemplary embodiments with reference to the attached drawings.

DESCRIPTION OF EMBODIMENTS

First Embodiment

Figure 1:
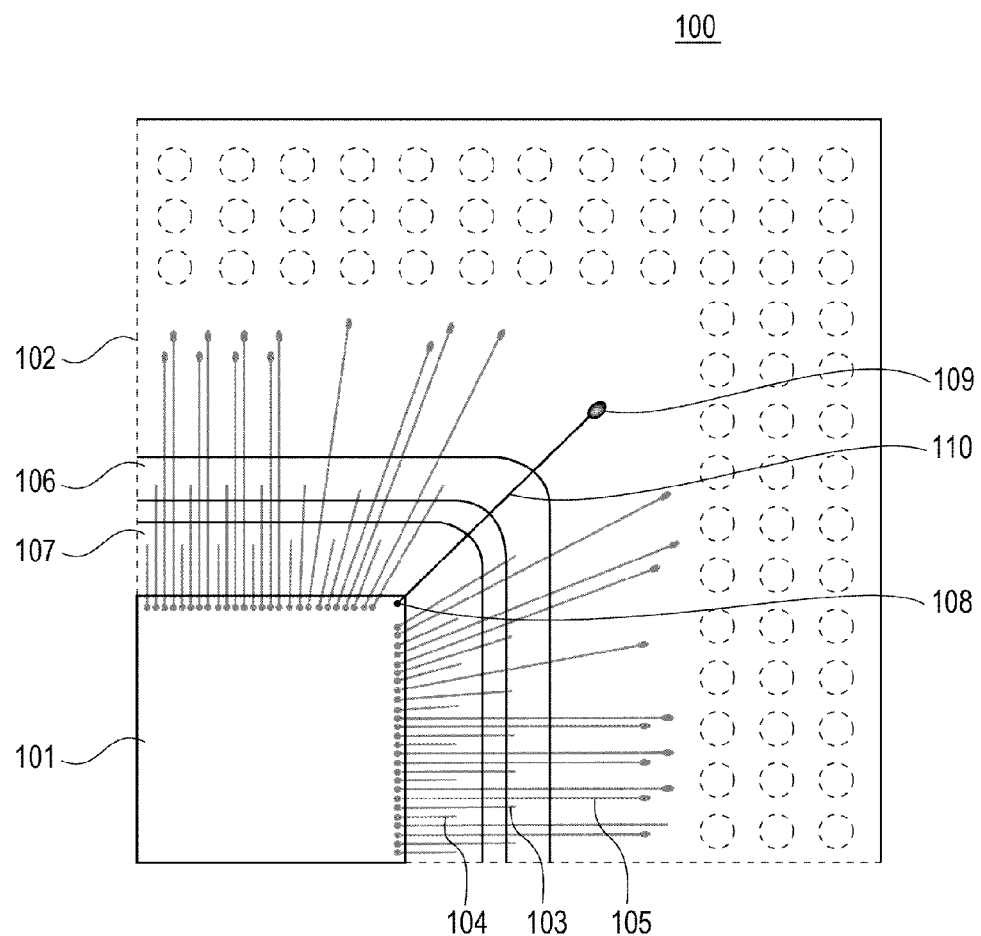
FIG. 1 is a diagram schematically illustrating a semiconductor device according to a first embodiment.

Referring to FIG. 1, a semiconductor device 100 according to a first embodiment of the present invention will be described. In FIG. 1, a semiconductor integrated circuit board 102 is mounted on a semiconductor integrated circuit 101. The semiconductor integrated circuit 101 and the semiconductor integrated circuit board 102 are electrically connected to each other through bonding wires 103. The bonding wires 103 which supply electric power potentials to the semiconductor integrated circuit 101 are connected to an electric-power potential ring pattern 106 (power-supply pattern) which is disposed on a periphery of the semiconductor integrated circuit 101 disposed on the semiconductor integrated circuit board 102.

Bonding wires 104 which supply GND potentials to the semiconductor integrated circuit 101 is connected to a GND ring pattern 107 disposed on the semiconductor integrated circuit board 102. Bonding wires 105 (signal bonding wires) which allow signals externally input to or output from the semiconductor integrated circuit 101 to be transmitted are connected to a signal pattern, not shown, disposed on the semiconductor integrated circuit board 102. Note that, in FIG. 1, the GND ring pattern 107 is disposed on the periphery of the semiconductor integrated circuit 101 and the electric-power potential ring pattern 106 is disposed on the periphery of the GND ring pattern 107. However, the arrangement order of the GND ring pattern 107 and the electric-power potential ring pattern 106 may be reversed.

On one of the corners of the semiconductor integrated circuit 101, an electric-power potential supply pad 108 is disposed. The electric-power potential supply pad 108 disposed on the semiconductor integrated circuit 101 is connected to a pad 109 which is not electrically connected to any other electric circuit and which is disposed in a vacant space included in the semiconductor integrated circuit board 102 through a bonding wire 110.

The pad (stub wiring pad) 109 connected to the bonding wire (stub wiring bonding wire) 110 serving as a stub wiring has a predetermined area. Therefore, a capacitance component is generated between the pad 109 and one of a GND (ground) layer and an electric-power layer which are formed on different layers of the semiconductor integrated circuit board 102. Accordingly, the bonding wire 110 and the pad 109 constitute an LC resonant circuit on the semiconductor integrated circuit 101 in parallel to the GND bonding wires 104. The LC resonant circuit can suppress transmission of noise to the semiconductor integrated circuit board 102 since the LC resonant circuit functions as a high-frequency noise filter.

Assuming that an inductance value of the bonding wire 110 is denoted by "L", and a value of a floating capacitance of the pad 109 which is in an electrically open state is denoted by "C", the relationship between the inductance value L and the floating capacitance value C and a frequency f of noise which can be efficiently suppressed is represented by Expression (1) below.

$$f = \frac{1}{2\pi\sqrt{LC}} \quad \text{[Math. 1]}$$

Accordingly, a length of the bonding wire 110 serving as the stub wiring and a size of the pad 109 are controlled so that the inductance value calculated so as to satisfy Expression (1) corresponds to an integral multiple of a basic operation frequency. Furthermore, the bonding wire 110 is disposed in a three-dimensional manner relative to the GND bonding wires 104 and the bonding wires 105. Therefore, the pad 109 may be disposed in any portion in the vacant space of the semiconductor integrated circuit board 102. Accordingly, high degrees of freedom of a pattern length and a pattern width of the bonding wire 110 are attained. Furthermore, the vacant space of the semiconductor integrated circuit board 102 is considerably larger than a printed wiring board, and accordingly, implementation of a stub inside the semiconductor device is effective.

Example 1

Figure 5:
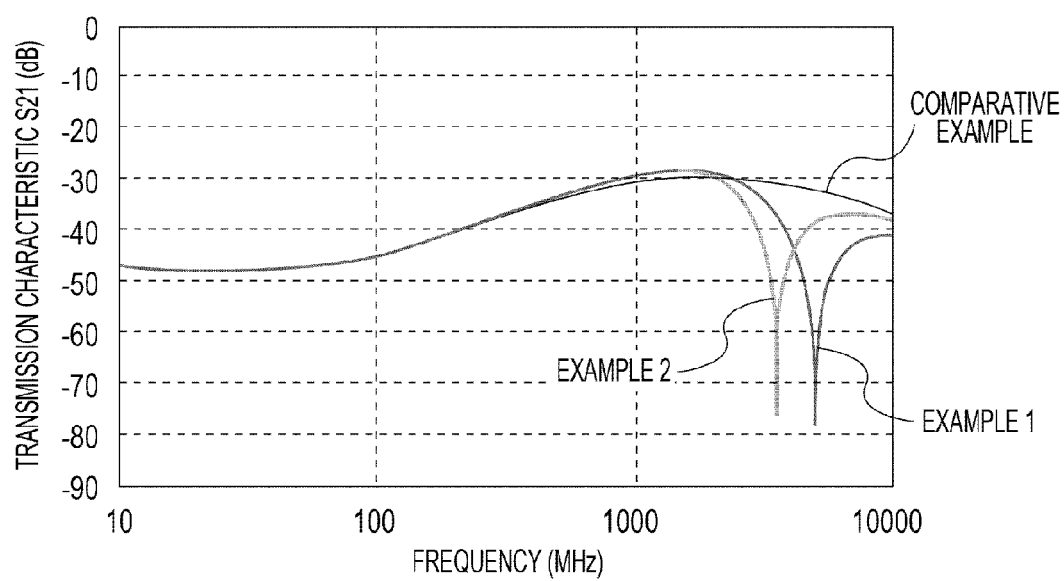
FIG. 5 is a graph illustrating results of simulations of examples 1 and 2 and a comparative example.

A simulation is performed using the semiconductor device 100 shown in FIG. 1. As a model of the simulation, the bonding wire 110 corresponds to a gold line having a diameter of 20 micrometer and a length of 2 mm, and a size of the pad 109 which is not electrically connected to any other electric circuit is formed of a copper foil having a size of 500 micrometer square. In this case, an inductance value is substantially 2 nH and a capacitance value is substantially 1 pF. A characteristic of noise transmission is measured using a pad group which supplies a power supply potential to the bonding wire 110 and a pad group which supplies GND to the bonding wire 110. A transmission characteristic (S21) at a time when a signal to be transmitted has a frequency in a range from 10 MHz to 10 GHz is obtained. A result of the obtainment is shown in FIG. 5.

Second Embodiment

Figure 2:
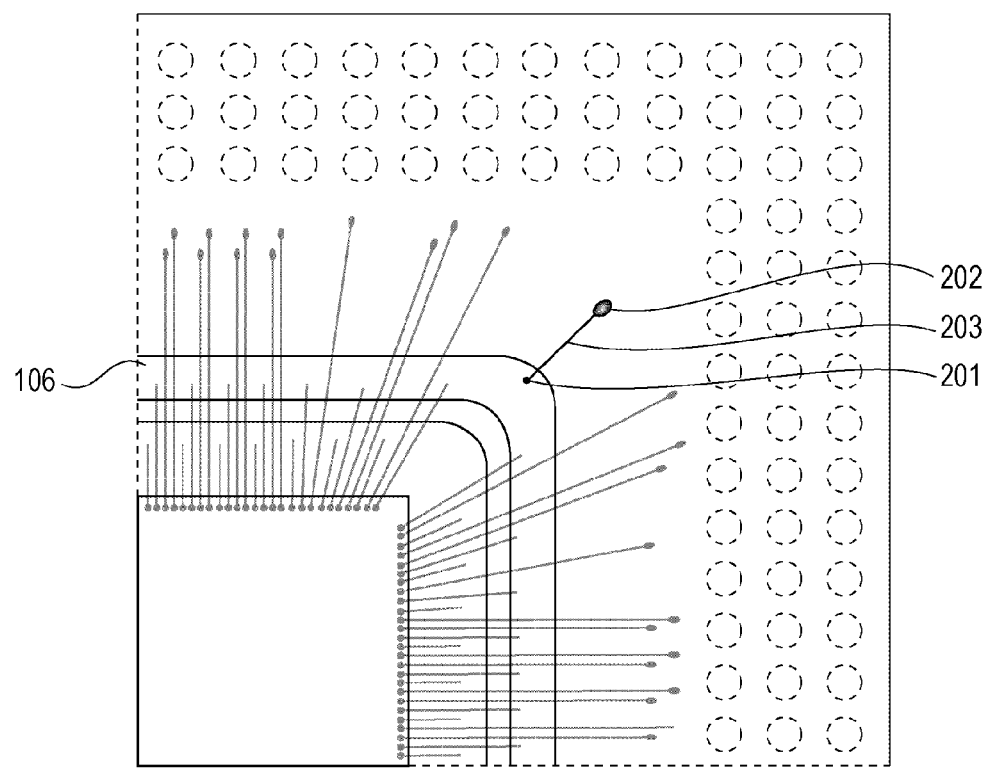
FIG. 2 is a diagram schematically illustrating a semiconductor device according to a second embodiment.

Referring to FIG. 2, a semiconductor device 200 according to a second embodiment of the present invention will be described. Note that components the same as those shown in FIG. 1 are denoted by reference numerals the same as those shown in FIG. 1. In FIG. 2, a bonding wire 203 is disposed instead of the bonding wire 110 shown in FIG. 1. The bonding wire 203 is used to connect an electric-power potentially supply pad 201 disposed on a power-supply potential ring pattern 106 to a pad 202 which is not electrically connected to any other electric circuit and which is disposed on a vacant space of a semiconductor integrated circuit board 102.

The pad 202 which is connected to the bonding wire 203 serving as a stub wiring has a predetermined area, and a capacitance component is generated between the pad 202 and one of a GND (ground) layer and an electric power layer which are formed in different layers of the semiconductor integrated circuit board 102. Therefore, the bonding wire 203 and the pad 202 constitute an LC resonant circuit in parallel to GND bonding wires 104 which supply electric power potentials to the semiconductor integrated circuit 101. Since the LC resonant circuit functions as a high-frequency noise filter, the LC resonant circuit suppresses transmission of noise to the semiconductor integrated circuit board 102.

Example 2

A simulation is performed using the semiconductor device 200 shown in FIG. 2. As a model of the simulation, a bonding wire 110 corresponds to a gold line having a diameter of 20 micrometer and a length of 1 mm, and a size of the pad 202 which is not electrically connected to any other electric circuit is formed of a copper foil having a size of 500 micrometer square. In this case, an inductance value is substantially 1 nH and a capacitance value is substantially 1 pF. A characteristic of noise transmission is measured using a pad group which supplies an electric power potential to the bonding wire 110 and a pad group which supplies a reference potential to the bonding wire 110. A transmission characteristic (S21) at a time when a signal to be transmitted has a frequency in a range from 10 MHz to 10 GHz is obtained. A result of the obtainment is shown in FIG. 5.

Comparative Example

Figure 6:
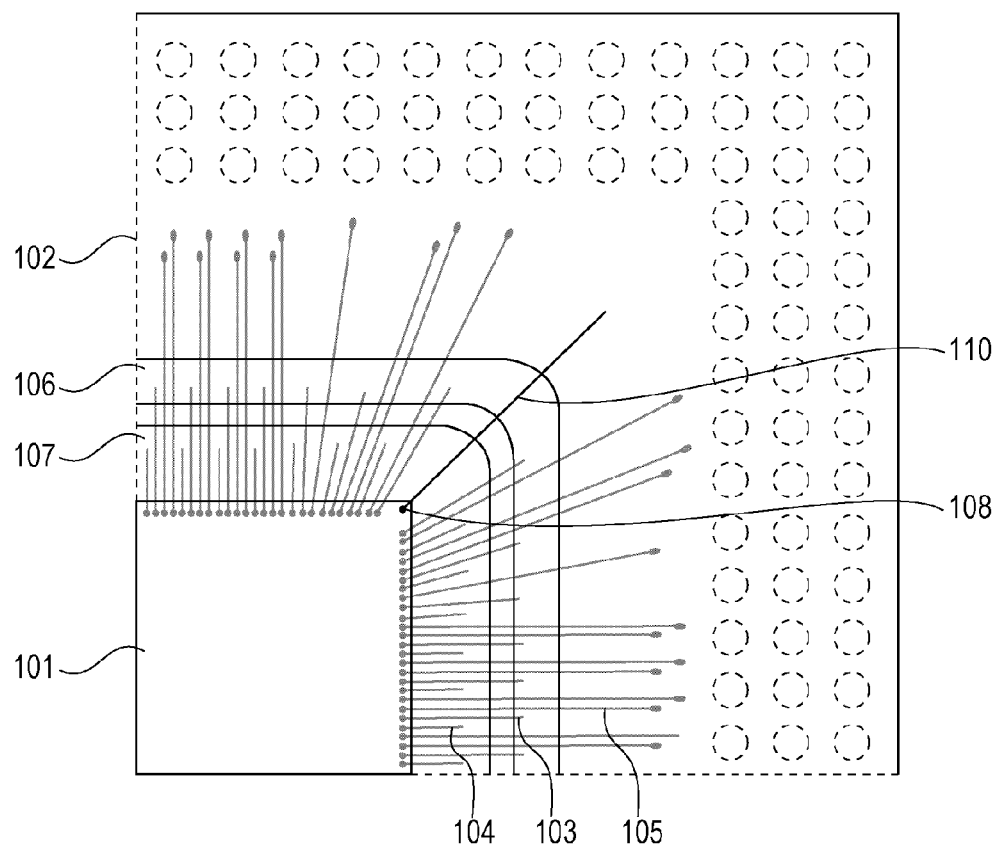
FIG. 6 is a diagram schematically illustrating a semiconductor device according to the related art.

A simulation is performed using a semiconductor device according to the related art shown in FIG. 6. A semiconductor device 500 shown in FIG. 6 is different from the semiconductor device 100 shown in FIG. 1 in that the semiconductor device 500 does not include the wire bonding 110 serving as the stub wiring. A transmission characteristic (S21) at a time when a signal to be transmitted has a frequency in a range from 10 MHz to 10 GHz is obtained. A result of the obtainment is shown in FIG. 5.

As shown in FIG. 5, the transmission characteristic (S21) of the example 1 is considerably reduced in a range between 2 GHz to 10 GHz including 5 GHz as a center when compared with the comparative example. Accordingly, noise between the range from 2 GHz to 10 GHz can be considerably suppressed. Furthermore, the transmission characteristic (S21) of the example 2 is considerably reduced in a range from 1 GHz to 8 GHz including 3 GHz as a center when compared with the comparative example. Accordingly, noise between the range from 3 GHz to 8 GHz can be considerably suppressed.

Third Embodiment

Figure 3:
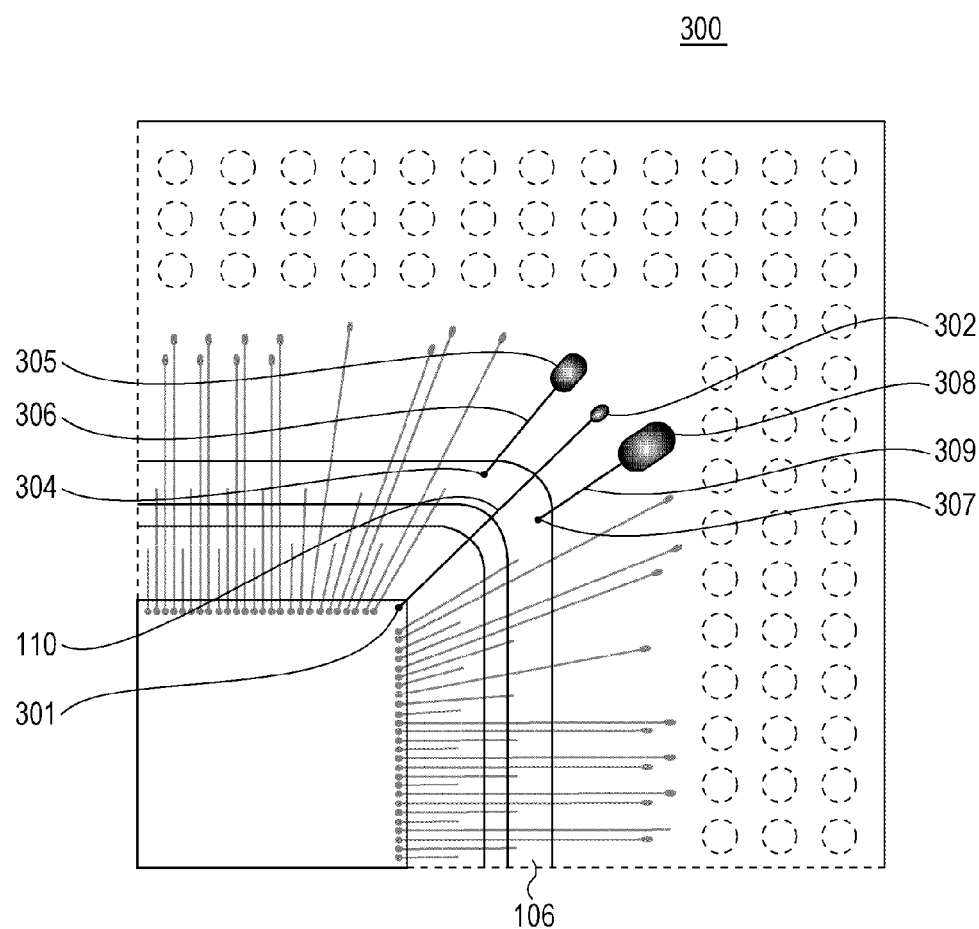
FIG. 3 is a diagram schematically illustrating a semiconductor device according to a third embodiment.

Referring to FIG. 3, a semiconductor device 300 according to a third embodiment will be described. Note that components the same as those shown in FIG. 1 are denoted by reference numerals the same as those shown in FIG. 1. In FIG. 3, a bonding wire 306 and a bonding wire 309 are disposed in addition to a bonding wire 110. The bonding wire 306 is used to connect an electric-power potential pad 304 disposed on a power-supply potential ring pattern 106 to a pad 305 disposed on a vacant space on the semiconductor integrated circuit board 102. The bonding wire 309 is used to connect an electric-power potential pad 307 disposed on the power-supply potential ring pattern 106 to a pad 308 disposed on the vacant space on the semiconductor integrated circuit board 102. A bonding wire 110 connects pad 301 to pad 302.

Since the bonding wires 306 and 309 serving as stub wirings are disposed separately from the bonding wire 110, inductance values of the bonding wires can be more strictly controlled. Furthermore, a range of control of a filter constant depending on a noise strength of a semiconductor integrated circuit can be made large. Moreover, since one of the pads 305 and 306 which are not electrically connected to any other electric circuit has a large area, a floating capacitance can be changed and a filter constant can be efficiently controlled in accordance with an operation frequency of the semiconductor integrated circuit.

Figure 4:
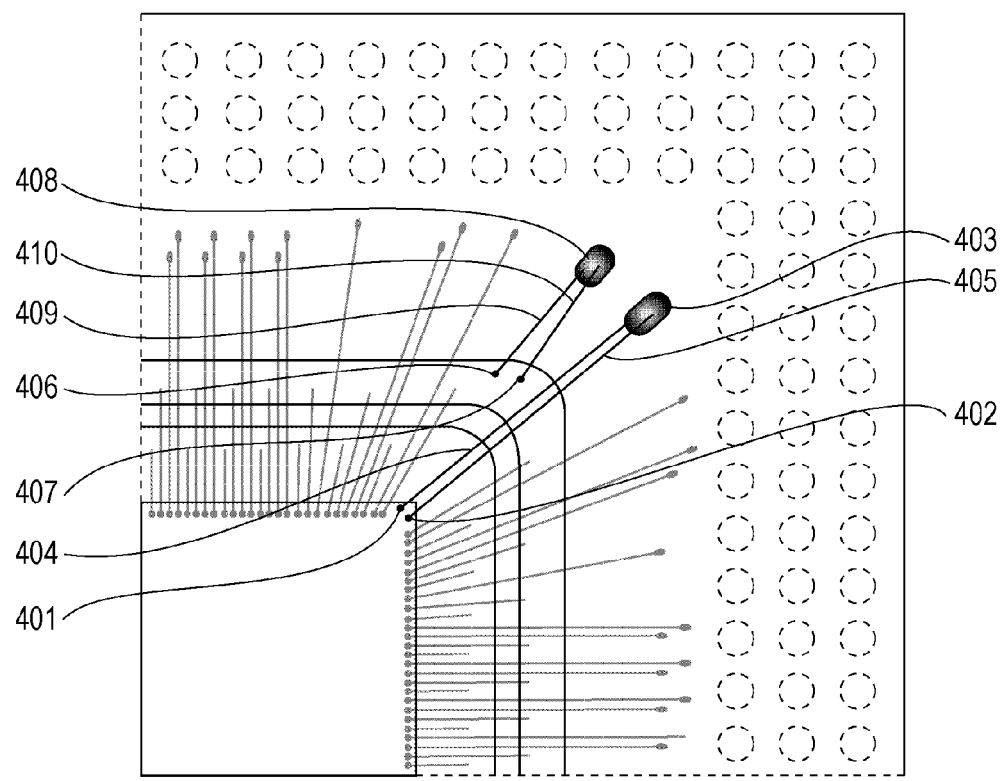
FIG. 4 is a diagram schematically illustrating a semiconductor device according to another embodiment.

Note that each of the bonding wires 110, 203, 306, and 309 of the first to third embodiments is a single wire. However, as shown in FIG. 4, a plurality of wires may be connected to a single pad disposed in a vacant space on the semiconductor integrated circuit board 102. For example, wire 404 connects pads 401 and 403; wire 405 connects pad 402 to 403; wire 409 connects pads 406 and 408; wire 410 connects pads 407 and 408. Since the plurality of wires are connected to the single pad, a range of control of a filter constant is made more larger.

Furthermore, each of the bonding wires 110, 203, 306, and 309 of the first to third embodiments is disposed at a corner portion of the semiconductor integrated circuit 101. In general, GND bonding wires, electric-power bonding wires, and signal bonding wires are not integrally disposed at the corner portion, and therefore, a vacant region comparatively remains on the semiconductor integrated circuit board 102. However, if a vacant region remains in a portion other than the corner portion, the bonding wires 110, 203, 306, and 309 may be disposed in the portion other than the corner portion.

In addition, a bonding wire serving as a stub wiring is not required to be connected to a pad disposed on a semiconductor integrated circuit board. A pad which is not electrically connected to any other electric circuit may be disposed on a semiconductor integrated circuit board or a printed wiring board of another semiconductor device.

According to the embodiments of the present invention, since a stub wiring is formed making use of a vacant region in a semiconductor device, effect of noise reduction is attained while a printed circuit board is implemented with high density. Furthermore, since a degree of freedom of the stub wiring is high, optimum shape for a noise frequency to be suppressed can be attained.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-258196, filed Nov. 11, 2009, which is hereby incorporated by reference herein in its entirety.

The invention claimed is:

1. A semiconductor device comprising:
a semiconductor integrated circuit board;
a semiconductor integrated circuit mounted on the semiconductor integrated circuit board;
pads which are disposed on the semiconductor integrated circuit; and
pads which are disposed on the semiconductor integrated circuit board and which are connected to the pads disposed on the semiconductor integrated circuit through bonding wires,
wherein the bonding wires include,
electric-power bonding wires, ground bonding wires, signal bonding wires and at least one stub wiring bonding wire, each of the electric-power bonding wires configured to connect an electric-power pad disposed on the semiconductor integrated circuit board to an electric-power ring pad disposed on a periphery of the semiconductor integrated circuit,
the ground bonding wires configured to connect a ground pad disposed on the semiconductor integrated circuit board to a ground ring pad disposed on a periphery of the semiconductor integrated circuit,
the signal bonding wires configured to connect a signal pad disposed on the semiconductor integrated circuit board to a signal pad disposed on the semiconductor integrated circuit, and
the stub wiring bonding wire disposed on at least one of corner areas of the semiconductor integrated circuit, configured to connect an electric-power pad disposed on the semiconductor integrated circuit to a pad which is not electrically connected to any other electric circuit (non-connected pad) and which is disposed on the semiconductor integrated circuit board.

2. The semiconductor device according to claim 1, wherein a stub wiring bonding wire is further disposed between the electric-power potential ring pattern and a non-connected pad which is not electrically connected to any other electric circuit and which is disposed on the semiconductor integrated circuit board so as to connect the ground ring pattern to the non-connected pad.

3. The semiconductor device according to claim 1, wherein a plurality of stub wiring bonding wires are disposed between the electric-power pad disposed on the semiconductor integrated circuit and a pad which is not electrically connected to any other electric circuit.

4. The semiconductor device according to claim 1, wherein a value of a frequency f obtained in accordance with an expression below corresponds to an integral multiple of a basic operation frequency of the semiconductor integrated circuit:

$$f = \frac{1}{2\pi\sqrt{LC}}$$

where a value of a floating capacitance of the non-connected pad is denoted by "C" and an inductance value of the bonding wire is denoted by "L".

* * * * *